(12) United States Patent
Harada et al.

(10) Patent No.: US 10,520,930 B2
(45) Date of Patent: Dec. 31, 2019

(54) COMPONENT MOUNTING SYSTEM AND PROGRESS DISPLAY SYSTEM OF SET-UP WORK

(71) Applicant: Panasonic Intellectual Property Management Co., Ltd., Osaka (JP)

(72) Inventors: Kazuyoshi Harada, Osaka (JP); Takuya Yamazaki, Fukuoka (JP); Atsushi Nakazono, Kanagawa (JP); Hiroshi Ando, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 100 days.

(21) Appl. No.: 15/786,637

(22) Filed: Oct. 18, 2017

(65) Prior Publication Data
US 2018/0113444 A1   Apr. 26, 2018

(30) Foreign Application Priority Data
Oct. 25, 2016   (JP) .................... 2016-208627

(51) Int. Cl.
*G05B 15/00* (2006.01)
*G05B 19/418* (2006.01)
*G01D 7/00* (2006.01)

(52) U.S. Cl.
CPC ....... *G05B 19/41865* (2013.01); *G01D 7/005* (2013.01)

(58) Field of Classification Search
CPC .................................................. G05B 15/02

USPC .......................................................... 700/83
See application file for complete search history.

(56) References Cited

U.S. PATENT DOCUMENTS

| | | | | |
|---|---|---|---|---|
| 5,241,482 A * | 8/1993 | Iida | ..................... | G05B 19/4184 340/3.32 |
| 7,251,541 B2 * | 7/2007 | Shimizu | ............. | H05K 13/0882 700/121 |
| 7,797,822 B2 * | 9/2010 | Sakai | ...................... | H01L 24/83 29/832 |
| 7,801,634 B2 * | 9/2010 | Kurata | ............. | G05B 19/41865 700/108 |
| 8,240,028 B2 * | 8/2012 | Kanai | ................ | H05K 13/0413 29/739 |

(Continued)

FOREIGN PATENT DOCUMENTS

| | | |
|---|---|---|
| JP | 2003-323205 A | 11/2003 |
| JP | 2012-043184 A | 3/2012 |

(Continued)

*Primary Examiner* — Suresh Suryawanshi
(74) *Attorney, Agent, or Firm* — Pearne & Gordon LLP

(57) ABSTRACT

A component mounting system includes a component mounting line, a storage device, and a display device. The component mounting line is formed by connecting a plurality of mounting board manufacturing machines. The storage device is connected to the component mounting line via a network to acquire information from each of the plurality of mounting board manufacturing machines. The display device is connected to the storage device via the network and displays a progress status of set-up work executed when changing a type of a mounting board manufactured by the component mounting line based on information stored in the storage device.

20 Claims, 7 Drawing Sheets

(56) References Cited

U.S. PATENT DOCUMENTS

| | | | |
|---|---|---|---|
| 2005/0125086 A1* | 6/2005 | Noda | G05B 19/41865 700/83 |
| 2008/0184114 A1* | 7/2008 | Hano | B29C 45/76 715/700 |
| 2015/0039115 A1* | 2/2015 | Sagara | G05B 19/41865 700/106 |
| 2015/0135524 A1* | 5/2015 | Yokomae | H05K 13/08 29/720 |
| 2015/0173205 A1* | 6/2015 | Maenishi | G05B 19/41865 29/832 |
| 2015/0271925 A1* | 9/2015 | Mori | H05K 13/0452 29/832 |
| 2016/0078682 A1* | 3/2016 | Shikoda | G06Q 10/06 345/633 |
| 2016/0116898 A1* | 4/2016 | Iwata | G05B 19/41865 700/117 |
| 2016/0170407 A1* | 6/2016 | Nakazono | G05B 19/41865 700/99 |
| 2016/0174426 A1* | 6/2016 | Kurata | H05K 13/084 29/739 |
| 2016/0255755 A1* | 9/2016 | Iisaka | H05K 13/08 29/739 |
| 2018/0249611 A1* | 8/2018 | Onishi | H04N 5/2257 |

FOREIGN PATENT DOCUMENTS

| | | |
|---|---|---|
| JP | 2015-028970 | 2/2015 |
| JP | 2015-065382 A | 4/2015 |
| JP | 2016058593 A * | 4/2016 |

* cited by examiner

COMPONENT MOUNTING SYSTEM AND PROGRESS DISPLAY SYSTEM OF SET-UP WORK

BACKGROUND

1. Technical Field

The present disclosure relates to a component mounting system and a progress display system of set-up work, which display a progress status of set-up work generated corresponding to a component mounting line.

2. Description of the Related Art

In a component mounting system having a component mounting line formed by connecting a plurality of mounting board manufacturing machines such as mounting machines for mounting a component on a board, mounting boards of various hoard types are produced in the component mounting line. When changing a board type produced in the component mounting line, so-called set-up work such as preparing a feeder (tape feeder or the like) for supplying a component for a new board type and disposing the feeder on a component supply carriage mounted on the mounting machine is executed by a plurality of workers.

For the purpose of improving the efficiency of such set-up work, a proposal has been made to support a worker by displaying various types of auxiliary information on a display screen provided in the mounting machine or the like (for example, see PTL 1). In PTL 1, in order to change an arrangement state of the feeder for production of a new board type from an arrangement state of current feeder, work instructions and a progress of work arranged according to work procedures to be executed by a worker are displayed on a display screen provided in a mounting machine or the like.

CITATION LIST

Patent Literature

PTL 1: Japanese Patent Unexamined Publication No. 2015-28970

SUMMARY

A component mounting system of the disclosure includes a component mounting line, a storage device, and a display device.

The component mounting line is formed by connecting a plurality of mounting board manufacturing machines. The storage device is connected to the component amounting line via a network to acquire information from each of the plurality of mounting board manufacturing machines.

The display device is connected to the storage device via the network and displays a progress status of set-up work executed when changing a type of a mounting board manufactured by the component mounting line based on information stored in the storage device.

A progress display system of set-up work of the disclosure includes a storage device and a display device.

The storage device is connected to a component mounting line formed by connecting a plurality of mounting board manufacturing machines via a network to acquire information from each of the plurality of mounting board manufacturing machines.

The progress display system of set-up work is connected to the storage device via the network and displays a progress status of set-up work performed when changing a type of a mounting board manufactured by the component mounting line, based on information stored in the storage device.

DETAILED DESCRIPTION

In the related art disclosed in PTL 1, the set-up work generated corresponding to a plurality of component mounting lines is executed by the plurality of workers. The set-up work of the component mounting line has various set-up works such as a carriage set-up for arranging feeders in a replacement component supply carriage and arrangement of nozzles on a nozzle changer. A plurality of set-up works may occur in the same time zone even in one mounting line and it may be difficult to grasp a progress status of the plurality of set-up works. In a case where the plurality of set-up works are generated in a plurality of mounting lines, it is more difficult to grasp the progress status than one mounting line.

Figure 3:
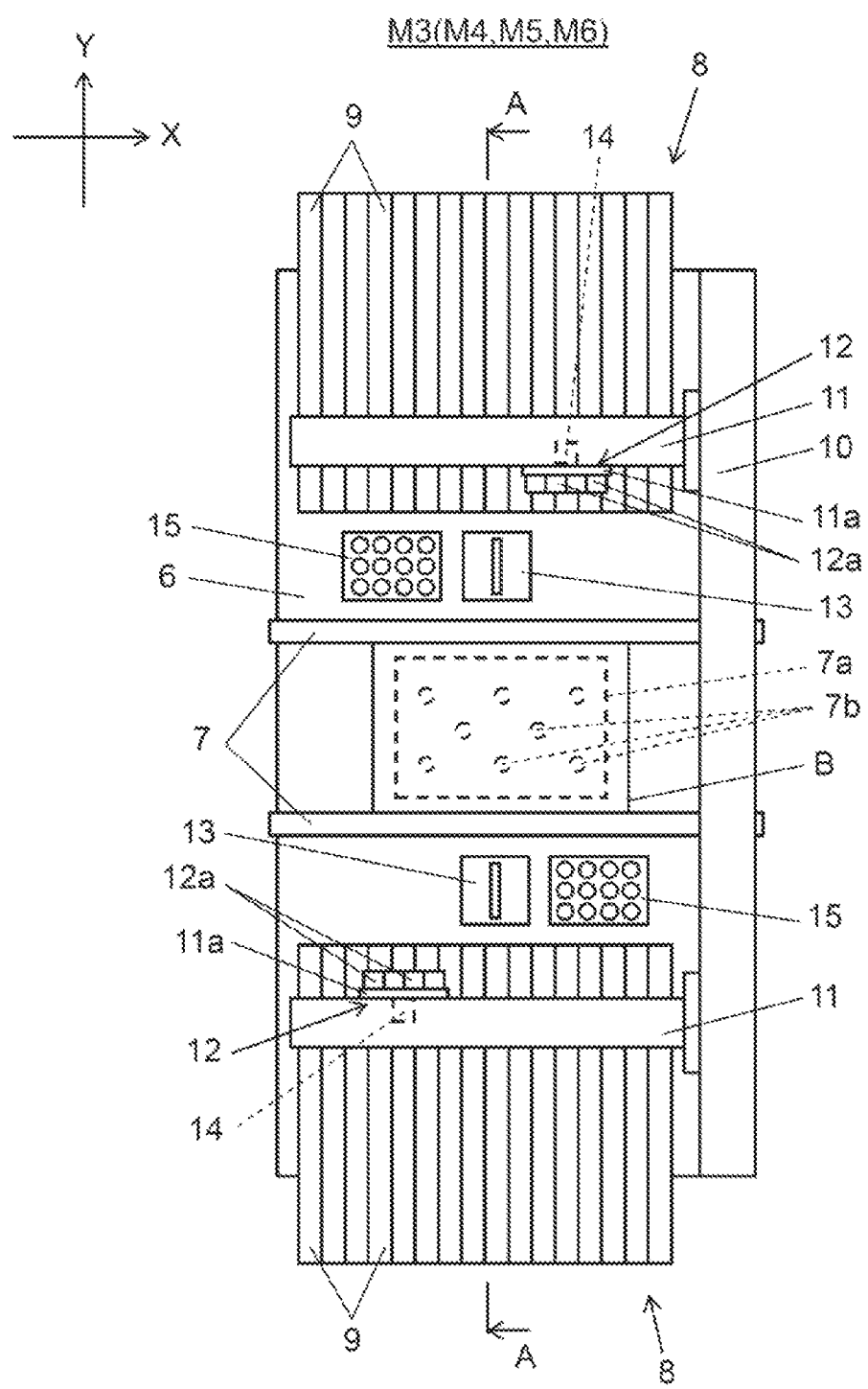
FIG. 3 is a plan view of a mounting machine included in the component mounting system of the embodiment.
Figure 4:
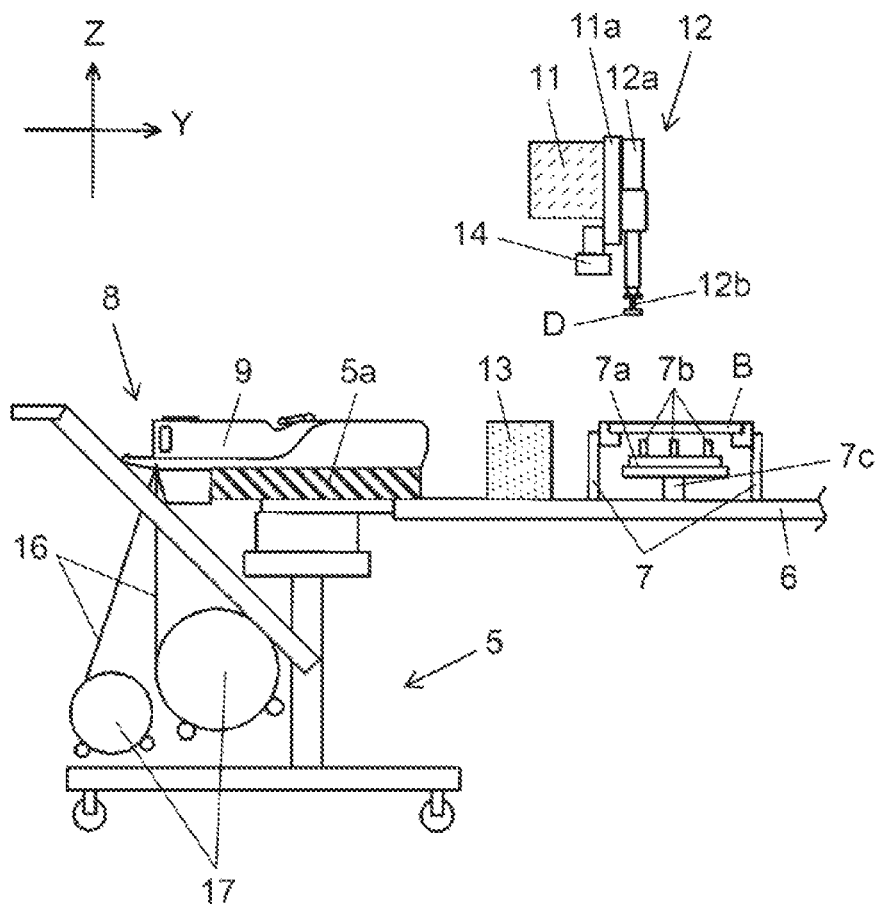
FIG. 4 is a partial sectional view of the mounting machine included in the component mounting system of the embodiment.

Hereinafter, an embodiment of the disclosure will be described in detail with reference to the drawings. Configurations, shapes, and the like described below are examples for explanation, and can be appropriately changed in accordance with the specifications of the component mounting system, the component mounting line, and a mounting machine. In the following description, the same reference numerals are given to corresponding elements in all drawings and redundant explanations will be omitted. In FIG. 3 and in a part to be described later, as two axial directions orthogonal to each other in a horizontal plane, an X direction (rightward and leftward direction in FIG. 3) indicates a board transport direction and a Y direction (upward and downward direction in FIG. 3) indicates a direction orthogonal to the board transport direction. In FIG. 4, a Z direction (upward and downward direction in FIG. 4) indicates a height direction orthogonal to the horizontal plane. The Z direction is the upward and downward direction or the orthogonal direction in a case where the mounting machine is provided on the horizontal plane.

Figure 1:
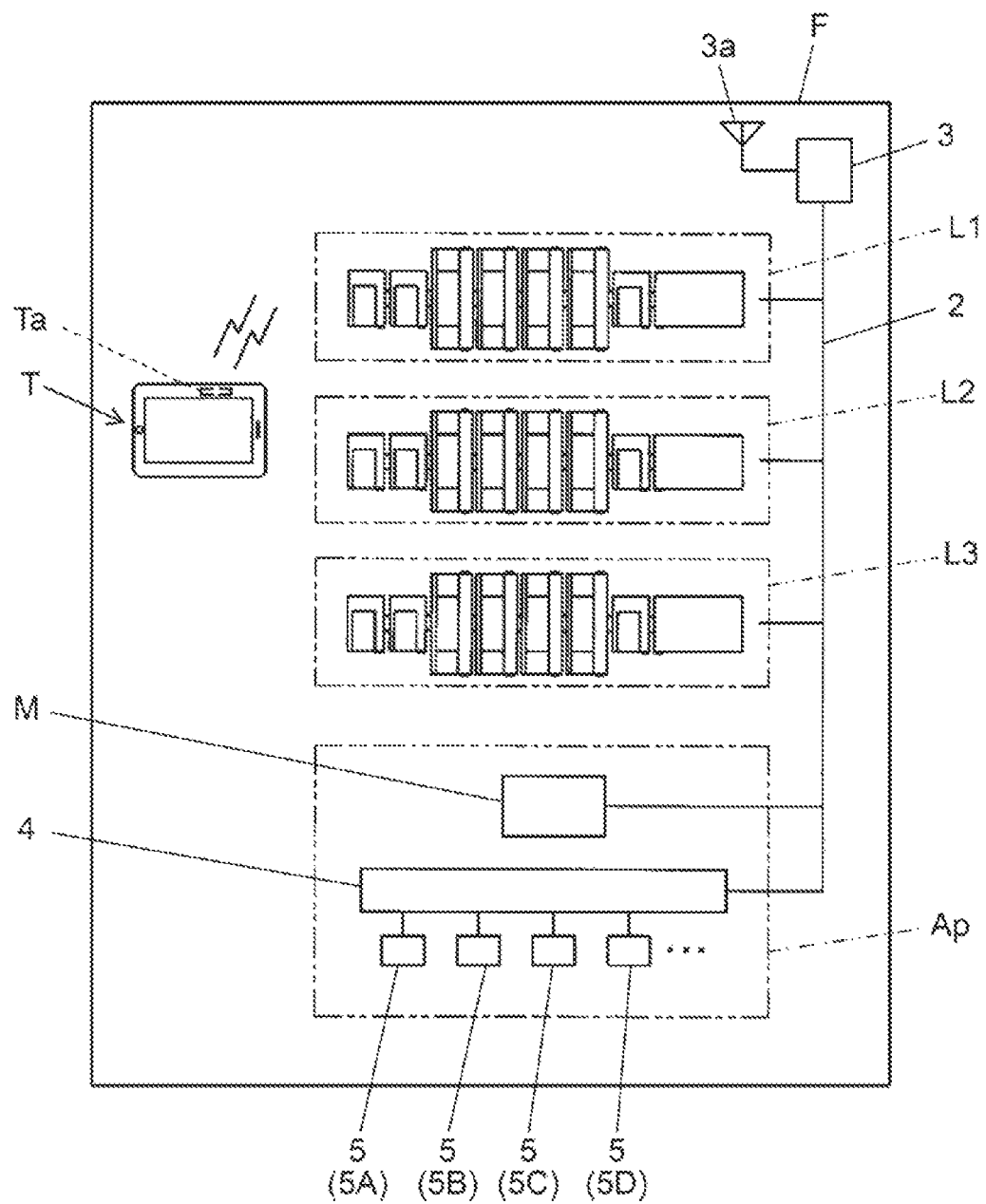
FIG. 1 is an explanatory view of a configuration of a component mounting system of an embodiment.

First, a configuration of component mounting system will be described with reference to FIG. 1. Component mounting system 1 has a configuration in which three component mounting lines L1 to L3 disposed on floor F are connected by communication network 2 and which is managed by management computer 3. Each of component mounting lines L1 to L3 is formed by connecting a plurality of mounting board manufacturing machines including mounting machines M3 to M6 (see FIG. 2) which are described later and has a function of producing a mounting board where a component is mounted on a board. That is, component mounting system 1 has a plurality of component mounting lines L1 to L3 formed by connecting a plurality of mounting board manufacturing machines. Component mounting line L1 included in component mounting system 1 is not limited to three and may be one, two, or four or more.

Component mounting system 1 has portable terminal T which performs wireless communication with management computer 3 by wireless communicator Ta. Management computer 3 has host-side communicator 3a which performs wireless communication with portable terminal T. Set-up work support device 4 and display device M are disposed in external set-up area Ap provided on floor F. Set-up work support device 4 and display device M are connected to management computer 3 via communication network 2. Set-up work support device 4 is connected to a plurality of replacement component supply carriages 5 (here, four component supply carriages 5A, 5B, 5C, and 5D) which are targets of the set-up work.

A plurality of tape feeders 9 for supplying components by a worker in charge of the set-up work are mounted on component supply carriage 5 connected to set-up work support device 4. If tape feeders 9 are mounted on component supply carriage 5 connected to set-up work support device 4, power is supplied to tape feeder 9 by set-up work support device 4 via component supply carriage 5 and a feeder controller built in tape feeder 9 (see FIG. 3) is in a communicable state with management computer 3. Therefore, a status of the set-up work such as a mounting status of tape feeder 9 on component supply carriage 5 and a supply status of a carrier tape holding a component to tape feeder 9 can be acquired in management computer 3.

As described above, in component supply carriage 5 connected to set-up work support device 4, it is possible to perform the set-up work without being affected by a production status of the mounting board in component mounting lines L1 to L3. That is, set-up work support device 4 supports the set-up work (hereinafter, referred to as an "external set-up work") which is executed without stopping the production of the mounting board in component mounting lines L1 to L3. Replacement component supply carriage 5 in which the external set-up work is completed is replaced with component supply carriage 5 of a replacement target mounted on mounting machines M3 to M6 in the set-up work (hereinafter, referred to as an "internal set-up work") which stops and executes the production of the mounting hoard in component mounting lines L1 to L3.

Display device M is configured to include a large-sized liquid crystal monitor or the like, and displays the progress status of the set-up work in component mounting system 1 transmitted from management computer 3. It is preferable that display device M is disposed at a position which is easy to see by a worker executing the set-up work such as a wall of external set-up area Ap or the like. External set-up area Ap is not necessarily disposed on the same floor F on which component mounting lines L1 to L3 are disposed and may be provided on another floor. Display device M may not be disposed independently from the component mounting line, or may be included in the mounting line. A display device (display 45) of each apparatus included in the component mounting line may be used as display device M.

Figure 2:
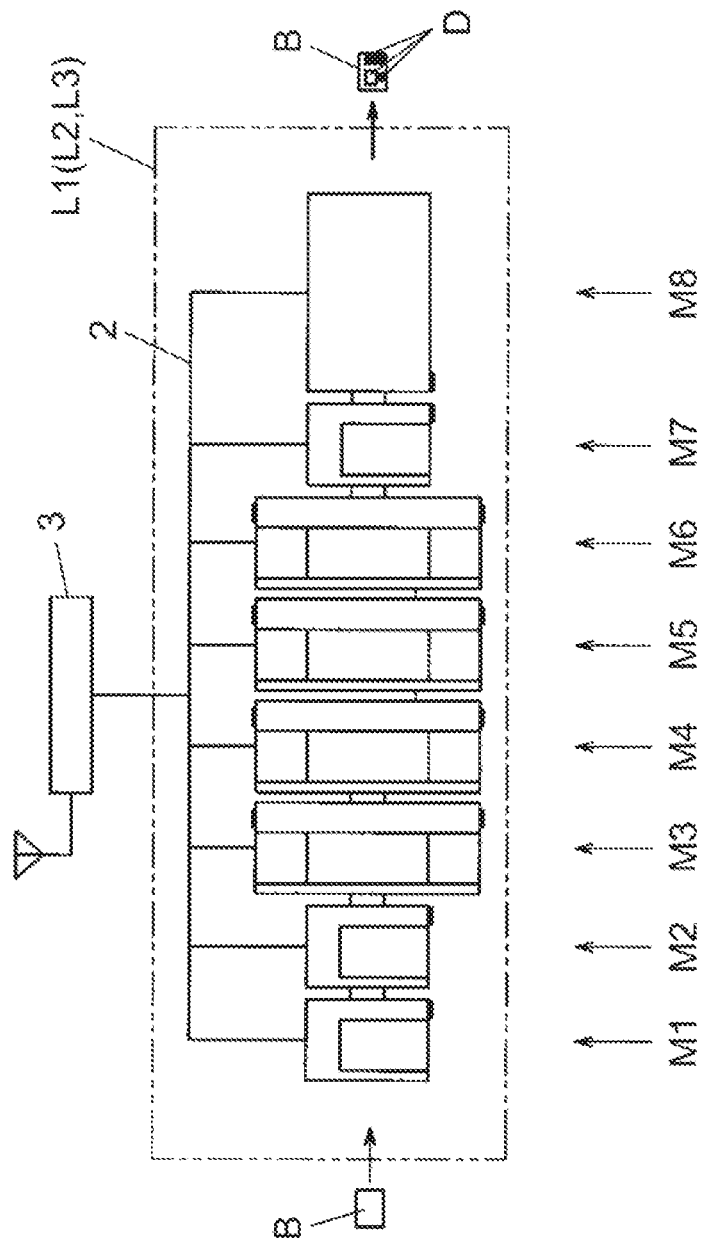
FIG. 2 is an explanatory view of a configuration of a component mounting line included in the component mounting system of the embodiment.

Next, a detailed configuration of component mounting lines L1 to L3 will be described with reference to FIG. 2. Component mounting lines L1 to L3 have the same configuration and hereinafter, component mounting line L1 will be described. Component mounting line L1 is formed by connecting in series the mounting board manufacturing machines such as solder printing apparatus M1, printing inspection apparatus M2, mounting machines M3 to M6, mounting inspection apparatus M7, and reflow apparatus M8 from an upstream side (left side of a paper surface) to a downstream side (right side of the paper surface) in the board transport direction.

Solder printing apparatus M1, printing inspection apparatus M2, mounting machines M3 to M6, mounting inspection apparatus M7, and reflow apparatus M8 are connected to management computer 3 via communication network 2. Solder printing apparatus M1 executes solder printing work of printing a solder on board B, which is carried in from the upstream side by a solder printing work unit, via a mask. Printing inspection apparatus M2 executes printing inspection work for inspecting a state of a printed solder on board B by a printing inspection work unit including a solder inspection camera.

Mounting machines M3 to M6 execute component mounting work for mounting component D on board B by a component mounting work unit. In component mounting line L1, the number of mounting machines M3 to M6 is not limited to four and may be one to three, or may be five or more. Mounting inspection apparatus M7 executes mounting inspection work for inspecting a state of component D mounted on board B by a mounting inspection work unit including a component inspection camera. Reflow apparatus M8 executes a board heating work in which board B carried in the apparatus is heated by a board heater, the solder on board B is hardened, and an electrode portion of board B and component D are joined.

Next, a configuration of mounting machines M3 to M6 will be described with reference to FIGS. 3 and 4. Mounting machines M3 to M6 have the same configuration and here, mounting machine M3 will be described. FIG. 4 is a sectional view of the mounting machine partially illustrating a cross section A-A in FIG. 3. Mounting machine M3 has a function of mounting component D on board B. In FIG. 3, board transport mechanism 7 is disposed at a center of base 6 in the X direction. Board transport mechanism 7 transports board carried in from the upstream side and positions board B at a position at which the component mounting work is executed. Lower receiving pin holding plate 7a, which is positioned below board B positioned in board transport mechanism 7 and where lower receiving pin 7b is mounted on an upper surface thereof, is disposed in board transport mechanism 7. Lower receiving pin holding plate 7a is lifted by lower receiving pin elevation driver 7c (see FIG. 4) so that lower receiving pin 7b abuts against a lower surface of board B and holds board B from the lower surface. Lower receiving pin holding plate 7a has a structure detachably attached to lower receiving pin elevation driver 7c and lower receiving pin 7b is detachably attached to lower receiving pin holding plate 7a.

Lower receiving pin 7b is appropriately disposed according to board B (manufactured mounting board) on which component D is mounted by preparatory work of lower receiving pin 7b by a worker. As the preparatory work of lower receiving pin 7b, it is possible to change the arrangement of lower receiving pins 7b in a state where lower receiving pin holding plates 7a are mounted on mounting machines M3 to M6 in the internal set-up work. As the preparatory work of lower receiving pin 7b, in the external set-up work, the arrangement of lower receiving pin 7b for the next mounting board is performed with respect to spare lower receiving pin holding plate 7a removed from mounting machines M3 to M6. In the internal set-up work, lower receiving pin holding plate 7a which is arranged can be also replaced with lower receiving pin holding plate 7a mounted on mounting machines M3 to M6.

Component suppliers 8 are disposed on both sides of board transport mechanism 7. The plurality of tape feeders 9 are disposed in parallel in each of component suppliers 8 in the X direction. Tape feeder 9 pitch-feeds the carrier tape storing component D in a tape feeding direction thereby supplying component D at a position at which a component is picked up by a mounting head of a component mounting mechanism which is described below.

Y-axis beam 10 having a linear drive mechanism is disposed at one end portion in the X direction on an upper surface of base 6 along the Y direction. Two X-axis beams 11 having linear drive mechanisms are coupled to Y-axis beam 10 to be movably in the Y direction. X-axis beams 11 are disposed along the X direction. Mounting heads 12 are respectively mounted on two X-axis beams 11 to be movably in the X direction. As illustrated in FIG. 4, mounting head 12 has a plurality of suction units 12a which are capable of ascending and descending by sucking and holding component D. Suction nozzle 121 is provided at each tip of suction units 12a.

In FIG. 3, Y-axis beam 10 and X-axis beam 11 are driven and thereby mounting head 12 moves in the X direction and the Y direction. Therefore, two mounting heads 12 suck and pick up components D from the component pick-up position of tape feeder 9 disposed in corresponding component suppliers 8 respectively using suction nozzles 12b, thereby mounting component D on a mounting point of board B positioned in board transport mechanism 7. Y-axis beam 10, X-axis beam 11, and mounting head 12 move mounting head 12 holding component D, thereby configuring the component mounting mechanism which performs mounting of component D on board B.

Component recognition camera 13 is disposed between component. supplier 8 and board transport mechanism 7. When mounting head 12 which picks up a component from component supplier 8 moves above component recognition camera 13, component recognition camera 13 images component D of a state of being held in mounting head 12 and recognizes a holding posture of component D. Board recognition camera 14 is attached to plate 11a to which mounting head 12 is attached. Board recognition camera 14 integrally moves with mounting head 12.

As mounting head 12 moves, board recognition camera 14 moves to above board B positioned in hoard transport mechanism 7 and a board mark (not illustrated) provided on board B is imaged to recognize the position of board B. In a component mounting operation on board B by mounting head 12, a mounting position is corrected taking into account a recognition result of component D by component recognition camera 13 and a recognition result of the board position by board recognition camera 14.

In FIG. 3, nozzle holder 15 is detachably disposed between component supplier 8 and hoard transport mechanism 7. A plurality of suction nozzles mounted on mounting head 12 are stored in nozzle holder 15 to be held corresponding to a component type. Mounting head 12 accesses nozzle holder 15 and performs a nozzle replacing operation so that it is possible to replace suction nozzle 12b mounted on suction unit 12a depending on the component type.

In FIG. 4, component supplier 8 is configured of component supply carriage 5 where the plurality of tape feeders 9 are mounted on feeder base 5a in advance. Component supply carriage 5 is detachably configured with respect to base 6. Tape feeder 9 is mounted on feeder base 5a so that the feeder controller built in tape feeder 9 is electrically connected to mounting controller 21 (see FIG. 5) of mounting machines M3 to M6. Component supply carriage 5 holds supply reel 17 that stores carrier tape 16 in a state where carrier tape 16 is wound. Carrier tape 16 picked up from supply reel 17 is mounted on tape feeder 9. Tape feeder 9 pitch-feeds carrier tape 16 picked up from supply reel 17 to the component pick-up position sing suction nozzle 12b.

As described above, mounting machine M3, board transport mechanism 7, the component mounting mechanism (Y-axis beam 10, X-axis beam 11, and mounting head 12), component recognition camera 13, and board recognition camera 14 configure component mounting work unit 18 (see FIG. 5) that mounts component D supplied by component supplier 8 on transported board B by transporting board B.

Figure 5:
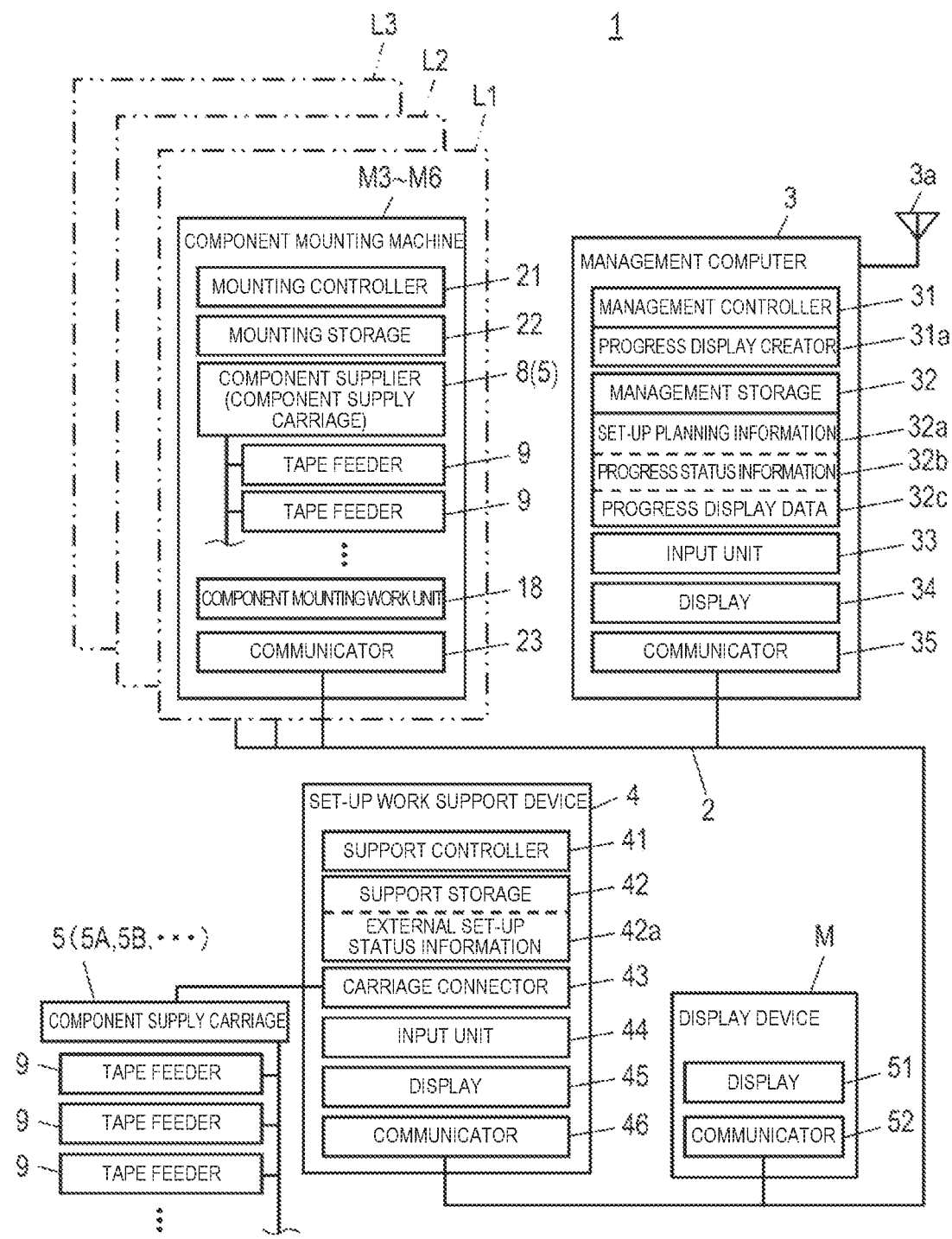
FIG. 5 is a block diagram illustrating a configuration of a control system of the component mounting system of the embodiment.

Next, a configuration of a control system of component mounting system 1 will be described with reference to FIGS. 5 and 7. In FIG. 5, component mounting lines L1 to L3 included in component mounting system 1 have the same configuration and, hereinafter, component mounting line L1 will be described. Mounting machines M3 to M6 included in component mounting line L1 have the same configuration and, hereinafter, mounting machine M3 will be described.

In FIG. 5, mounting machine M3 has mounting controller 21, mounting storage 22, component supplier 8, component mounting work unit 18, and communicator 23. Communicator 23 is a communication interface and performs receiving and transmitting a signal or data between other mounting machines M4 to M6, other component mounting lines L2 and L3, and management computer 3 via communication network 2. Mounting controller 21 executes the component mounting work by mounting machine M3 by controlling tape feeder 9 mounted on component supplier 8 and component mounting work unit 18 based on component mounting data stored in mounting storage 22.

Mounting controller 21 transmits a progress status of the set-up work such as replacing work of tape feeder 9 in the internal set-up work, replacing work of carrier tape 16 supplied by tape feeder 9, and replacing work of component supply carriage 5 to management computer 3 via communicator 23.

In FIG. 5, management computer 3 has management controller 31, management storage 32, input unit 33, display 34, communicator 35, and host-side communicator 3a. Input unit 33 is an input device such as a keyboard, a touch panel, or a mouse, and is used when inputting an operation command or data. Display 34 is a display device such as a liquid crystal panel and displays various screens such as an operation screen for operation by input unit 33 and various types of information such as the progress status of the set-up work. Communicator 35 is a communication interface and performs receiving and transmitting a signal or data between mounting machines M3 to M6 of component mounting lines L1 to L3, set-up work support device 4, and display device M via communication network 2. Host-side communicator 3a performs receiving and transmitting a signal or data wirelessly from/to portable terminal T.

Management controller 31 is an arithmetic apparatus such as central processing unit (CPU) and manages component mounting system 1 based on information stored in management storage 32. Management controller 31 has progress display creator 31a as an internal processing function.

Management storage 32 is a storage device and stores set-up planning formation 32a, progress status information 32b, progress display data 32c, and the like in addition to the component mounting data.

FIG. 5, set-up planning information 32a stores various types of information regarding the set-up work generated corresponding to a change of the mounting board produced in component mounting lines L1 to L3 which is planned for a predetermined period of time (for example, one day) in component mounting system 1. More specifically, set-up planning information 32a stores information in which the order number of the mounting board specifies component mounting lines L1 to L3 producing the mounting board. Set-up planning information 32a stores scheduled completion time Tps, scheduled changing time Tis, and scheduled production start time Tss in association with the order number.

Scheduled completion time Tps is a scheduled time at which the external set-up work using set-up work support device 4 generated corresponding to a change to the mounting board of the associated order number is completed. Scheduled changing time Tis is a scheduled time at which the internal set-up work generated corresponding to the change to the mounting board of the associated order number is started, that is, a scheduled time at which component mounting lines L1 to L3 that are targets of the internal set-up work are changed to production stop. Scheduled production start time Tss is a scheduled time at which all the set-up work generated corresponding to the change to the mounting board of the associated order number are completed and the production or the mounting board of the order number is started.

Set-up planning information 32a stores scheduled carriage number Ncs of component supply carriages 5 which are the targets of the external set-up work generated corresponding to the change of the produced mounting board in association with the order number. Set-up planning information 32a stores planned person number Nps of workers assigned for performing the set-up work generated corresponding to the change of the produced mounting board in association with the order number.

Set-up planning information 32a stores the presence or absence of other external set-up work of the component replacement that is the target of the external set-up work generated corresponding to the change of the produced mounting board in association with the order number. Other external set-up work includes, for example, includes preparatory work of a mask used in solder printing apparatus M1, preparatory work of suction nozzle 12b, preparatory, work of lower receiving pin 7b, and the like.

In FIG. 5, progress status information 32b acquires and stores information of the progress status of the internal set-up work executed in mounting machines M3 to M6 of component mounting lines L1 to L3, information of the progress status of the external set-up work executed in set-up work support device 4, and information of the progress status of the external set-up work input by a worker transmitted from portable terminal T via communicator 35 or host-side communicator 3a.

That is, management storage 32 of management computer 3 is connected to the plurality of component mounting lines L1 to L3 via communication network 2 and acquires information from mounting machines M3 to M6 (mounting board manufacturing machine) via communication network 2. Management storage 32 is a storage device that is connected to set-up work support device 4 via communication network 2, acquires information from set-up work support device 4 via communication network 2, and acquires information of the progress of the set-up work from portable terminal T via wireless communication.

Progress display creator 31a creates progress display data 32c including various progress statuses displayed on display 51 of display device M or display 34 of management computer 3 based on set-up planning information 32a and progress status information 32b. Created progress display data 32c is stored in management storage 32.

More specifically, progress display creator 31a calculates estimated completion time Tpe, estimated changing time Tie, and estimated production start time Tse based on progress status information 32b with respect to scheduled completion time Tps, scheduled changing time Tis, and scheduled production start time Tss stored in set-up planning information 32a, and stores them as progress display data 32c.

That is, estimated completion time Tpe is an estimated time at which the external set-up work is completed using set-up work support device 4. Estimated changing time Tie is an estimated time at which component mounting lines L1 to L3 that are targets of the internal set-up work are changed to the production stop. Estimated production start time Tse is an estimated time at which the production of the mounting board of which all the set-up work are completed is started. Progress display creator 31a calculates work delay time Tpd with respect to scheduled completion time Tps by scheduled completion time Tps and estimated completion time Tpe, and stores work delay time Tpd as progress display data 32c. That is, work delay time Tpd is a delay time of the external set-up work using predicted set-up work support device 4.

Progress display creator 31a calculates progress rate tip of the external set-up work based on progress status information 32b and stores progress rate Rp as progress display data 32c. Progress rate Rp is calculated as a ratio of the external set-up work that is completed at the current time assuming that all the external set-up work using set-up work support device 4 is 100%. Progress rate Rp may be calculated as a ratio of the external set-up work that is calculated at the current time assuming that other scheduled external set-up work which is weighted respectively and is added to all the external set-up work using set-up work support device 4 is 100%.

Progress display creator 31a also stores unplanned person number Npa of workers assigned by adding by a manager for executing the set-up work as progress display data 32c. Unplanned person number Npa is input by a manager who determines to add a worker from the progress status.

In FIG. 5, set-up work support device 4 has support controller 41, support storage 42, carriage connector 43, input unit 44, display 45, and communicator 46. Input unit 44 is an input device such as a keyboard, a touch panel, or a mouse, and is used when inputting an operation command or data. Display 45 is a display device such as a liquid crystal panel and displays various screens such as an operation screen for operation by input unit 44 and various types of information such as a procedure of the set-up work and the progress status of the set-up work. The procedure of the set-up work is information created by a work procedure creator (not illustrated) included in management computer 3 or the like, and includes a mounting position of tape feeder 9 and a mounting procedure on component supply carriage 5, designation of carrier tape 16 mounted on tape feeder 9, and the like.

Communicator 46 is a communication interface and performs receiving and transmitting a signal or data from/to management computer 3 via communication network 2.

Support controller 41 is an arithmetic apparatus such as a CPU and controls set-up work support device 4 based on information stored in support storage 42. Support storage 42 is a storage device and stores external set-up status information 42a or the like. Carriage connector 43 is connected to replacement component supply carriage 5 (component supply carriage 5A or the like of FIG. 1). Carriage connector 43 communicates with a feeder controller built in tape feeder 9 mounted on component supply carriage 5 via component supply carriage 5.

Carriage connector 43 sequentially acquires the status of the external set-up work such as the mounting status of tape feeder 9 on component supply carriage 5 and the supply status of carrier tape 16 to tape feeder 9, and stores them in support storage 42 as external set-up status information 42a. Support controller 41 transmits external set-up status information 42a to management computer 3 via communicator 46. The transmitted information is stored in management storage 32 in management computer 3 as progress status information 32b. External set-up status information 42a may be input by input unit 44 included in set-up work support device 4 by a worker to report the status of the external set-up work.

In FIG. 5, display device M has display 51 and communicator 52. Communicator 52 is a communication interface and performs receiving and transmitting a signal or data from/to management computer 3 via communication network 2. Display 51 is a display device such as a liquid crystal panel and displays various types of information such as the progress status included in progress display data 32c stored in management storage 32 (storage device) transmitted from management computer 3.

That is, display device M displays the progress status of the set-up work generated corresponding to the change of the mounting boards respectively produced in the plurality of component mounting lines L1 to L3 based on the information stored in management storage 32 (storage device). Display device M has a temporal storage that temporarily stores progress display data 32c transmitted from management computer 3 and display 51 may display information stored in the temporal storage.

Figure 6:
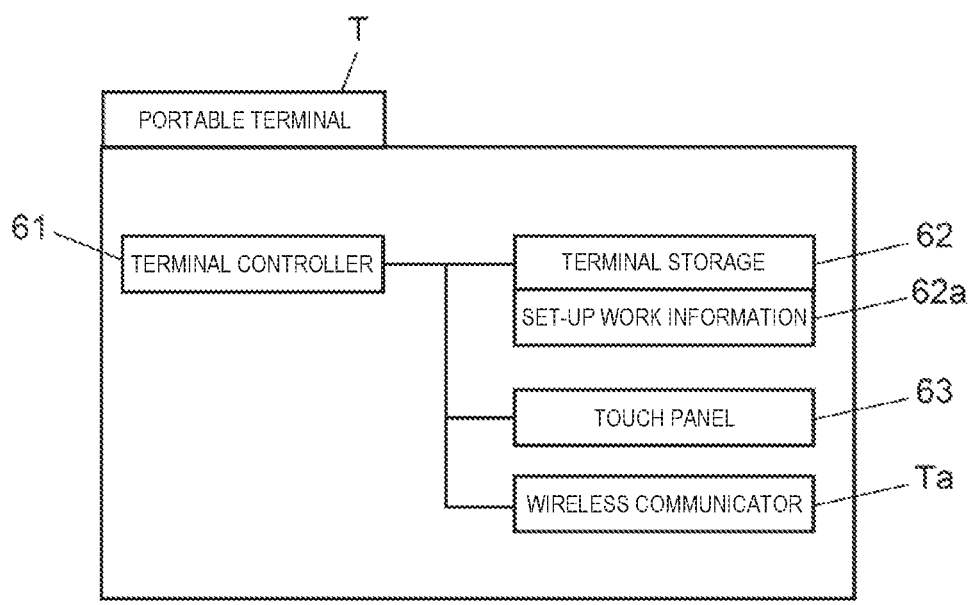
FIG. 6 is a block diagram illustrating a configuration of a control system of a portable terminal included in the component mounting system of the embodiment.

Next, a configuration of a control system of portable terminal be described with reference to FIG. 6. Portable terminal T has terminal controller 61, terminal storage 62, touch panel 63, and wireless communicator Ta, and performs receiving and transmitting a signal or data from/to management computer 3 via wireless communicator Ta. Touch panel 63 has an input function and a display function, and performs display of an operation/data input or various operation/guide screens necessary for the set-up work. Terminal controller 61 is an arithmetic apparatus such as a CPU and controls portable terminal T based on information stored in terminal storage 62. Terminal storage 62 is a storage device and stores set-up work information 62a or the like.

Information of other external set-up work such as preparatory work of a mask used in solder printing apparatus M1, preparatory work of suction nozzle 12b, and preparatory work of lower receiving pin 7b included in set-up planning information 32a is transmitted to set-up work information 62a by management computer 3. Touch panel 63 displays information of other external set-up work to be executed by a worker based on stored set-up work information 62a.

When the worker inputs a fact that other external set-up work is completed into touch panel 63, set-up work information 62a is updated and information from portable terminal T is transmitted to management computer 3, and then progress status information 32b stored in management storage 32 is also updated. That is, portable terminal T is carried by the worker who performs the set-up work (other external set-up work) and the progress of the set-up work is input by the worker.

Next, progress display image 70 displayed on display 51 of display device M will be described with reference to FIG. 7. Progress display image 70 may be displayed on display 34 of management computer 3. Progress display image 70 is displayed based on progress display data 32c created by progress display creator 31a based on progress status information 32b stored in management storage 32 (storage device) of management computer 3. The progress status of the plurality of set-up works is displayed on progress display image 70 in a list format (table). That is, display device M displays the progress status of the plurality of set-up works in the list format.

A "set-up progress" is displayed in an upper left of the table as title 71 and current time 72 (here, "19:15") is displayed in an upper right. In the table, various items such as "line" 73, "order number" 74, "production start time" 75, "changing start time" 76, "set-up completion time" 77, "work delay time" 78, "set-up progress rate" 79, "carriage" 80, "planned person number" 81, "unplanned person number" 82, and "other set-up" 83 are displayed corresponding to the order number. In progress display image 70, lists are arranged from a top in order of scheduled production start time Tss of the earlier order number.

Figure 7:
FIG. 7 is an explanatory view illustrating an example of a progress status displayed in a display device included in the component mounting system of the embodiment.

In FIG. 7, information for specifying component mounting lines L1 to L3 in which the mounting board of the order number is produced is displayed in "line" 73. Here, component mounting line L1 is displayed as "L1", component mounting line L2 is displayed as "L2", and component mounting line L3 is displayed as "L3". The order number is displayed in "order number" 74. Scheduled production start time Tss is displayed at a lower portion and estimated production start time Tse is displayed at an upper portion in "production start time" 75. That is, display device M displays scheduled production start time Tss that is a scheduled time at which the set-up work is completed in component mounting lines L1 to L3 and production of the next mounting board is started as the progress status.

Scheduled changing time Tis is displayed at a lower portion and estimated changing time Tie is displayed at an upper portion in "changing start time" 76. That is, display device M displays scheduled changing time Tis that is a scheduled time at which the set-up work (internal set-up work) which stops and executes the production of the mounting board in component mounting lines L1 to L3 is started as the progress status. Scheduled completion time Tps is displayed at a lower portion and estimated completion time Tpe is displayed at an upper portion in "set-up completion time" 77. That is, display device M displays scheduled completion time Tps that is a scheduled time at which the set-up work (external set-up work) is completed without stopping the production of the mounting board in component mounting lines L1 to L3 is completed as the progress status.

In FIG. 7, work delay time Tpd is displayed in "work delay time" 78. That is, display device M displays work delay time Tpd with respect to scheduled completion time Tps as the progress status. Work delay time Tpd displayed in "work delay time" 78 is configured such that a color such as a font color or a background color within a frame is changed according to a length of work delay time Tpd. For example, when work delay time Tpd is within 15 minutes, work delay time Tpd is displayed with a green font and when work delay time Tpd exceeds 15 minutes, work delay time Tpd is displayed with red font (oblique font in FIG. 7). That is, display device M performs a display with a color changed according to the length of work delay time Tpd.

Progress rate Rp scheduled is displayed at the current time at the lower portion a an actual result of progress rate Rp is displayed at the current time at the upper portion in "set-up progress rate" 79. That is, display device M displays progress rate Rp of the set-up work as the progress status. Scheduled carriage number Ncs is displayed at the lower portion and the number of replacement component supply carriages 5 of which the external set-up work is completed is displayed at the upper portion in "carriage" 80.

In FIG. 7, planned person number Nps is displayed at the lower portion and the number of workers engaged in the set-up work at the current time among planned person number Nps is displayed at the upper portion in "planned person number" 81. Unplanned person number Npa is displayed at the lower portion and the number of workers engaged in the set-up work at the current time among unplanned person number Npa at the upper portion in "unplanned person number" 82 is displayed. That is, display device M displays the number of workers (planned person number Nps) in charge of the set-up work on a plan and the number of workers (unplanned person number Npa) in charge of the set-up work added other than the plan as the progress status.

"Other set-up" 83 is provided with columns for displaying the progress status of other external set-up work such as "mask preparation" 83*a*, "suction nozzle preparation" 83*b*, and "lower receiving pin preparation" 83*c* from the left. Information (here, a figure written as "in" a circle) for specifying the preparatory work of the mask used in solder printing apparatus M1 is displayed in "mask preparation" 83*a*. Information (here, a figure written as "n" in a circle) for specifying the preparatory work of suction nozzle 12*b* is displayed in "suction nozzle preparation" 83*b*. Information (here, a figure written as "p" in a circle) for specifying the preparatory work of lower receiving pin 7*b* is displayed in "lower receiving pin preparation" 83*c*.

In other external set-up work displayed in "other set-up" 83, the progress status is transmitted from portable terminal T held by a worker. If the progress status is changed, the color of the figure displayed according to the status is changed. In the example of FIG. 7, other external set-up work of which worker is not completed is displayed by a white circle and other external set-up work of which worker is completed is displayed by a black-painted circle. That is, display device M displays information (figure) for specifying the set-up work of which the progress is transmitted from portable terminal T by changing a color according to the progress transmitted from portable terminal T as the progress status.

"Information for specifying the set-up work" is not limited to the example illustrated in FIG. 7 and, for example, may be only a letter, or may be a figure schematically displaying target of the set-up work not including a letter. In "other set-up" 83, a state where "mask preparation" 83*a*, "suction nozzle preparation" 83*b*, and "lower receiving pin preparation" 83*c* are blank indicates that the corresponding external set-up work is not planned. As a method for indicating that the corresponding external set-up work is not planned, a figure indicating that the completion of the work in advance may be displayed besides the method for indicating in the black column illustrated in FIG. 7.

As described above, component mounting system 1 of the embodiment has the storage device (management storage 32) and display device M. The storage device is connected to component mounting line L1 (L2 and L3) formed by connecting the plurality of mounting board manufacturing machines (mounting machines M3 to M6) via communication network 2 to acquire information from the mounting board manufacturing machine. Display device M is connected to the storage device via communication network 2 and displays the progress status of the set-up work performed when changing the mounting board of component mounting line L1 (L2 and L3) based on information stored in the storage device. Therefore, a worker or a manager can accurately grasp the progress of the set-up work generated corresponding to component mounting line L1 (L2 and L3). The storage device (management storage 32) and display device M configure the progress display system of the set-up work.

According to the disclosure, it is possible to accurately grasp the progress of the set-up work generated corresponding to the plurality of component mounting lines.

The component mounting system and the progress display system of set-up work of the disclosure have an effect that it is possible to accurately grasp the progress of the set-up work generated corresponding to the component mounting line and are effective in a component mounting field in which a component is mounted on a board.

What is claimed is:

1. A component mounting system comprising:
    a plurality of component mounting lines, each of the component mounting lines having a plurality of connected mounting board manufacturing machines;
    a storage device connected to the plurality of component mounting lines via a network, the storage device being configured to acquire information from each of the plurality of mounting board manufacturing machines of each of the plurality of component mounting lines; and
    a display device connected to the storage device via the network, the display device being configured to display a progress status of each of the plurality of component mounting lines, including a progress status of set-up work of a first work order performed when changing a type of mounting board manufactured by a first of the component mounting lines, based on the information stored in the storage device,
    wherein the display device is further configured to display, as the progress status of the first of the component mounting lines:
        a scheduled completion time at which the set-up work of the first work order is to be completed without stopping production of the mounting board in the first of the component mounting lines; and
        a work delay time of the first work order of the first of the component mounting lines with respect to the scheduled completion time.

2. The component mounting system of claim 1, further comprising:
    a set-up work support device connected to the storage device via the network, the set-up work support device being configured to support the set-up work of the first work order without stopping production of the mounting board in the first of the component mounting lines,
    wherein the storage device is further configured to acquire information from the set-up work support device via the network.

3. The component mounting system of claim 1, wherein the display device is further configured to display a progress rate of the set-up work of the first work order as the progress status of the first of the component mounting lines.

4. The component mounting system of claim 1, wherein the display device is further configured to display the progress status of the first of the component mounting lines with a color changed according to a length of the work delay time.

5. The component mounting system of claim 1, wherein the display device is further configured to display, as the progress status of the first of the component mounting lines:
the number of workers who are in charge of the set-up work of the first work order on a plan; and
the number of workers who are in charge of the set-up work of the first work order added other than the plan.

6. The component mounting system of claim 1, wherein the set-up work of the first work order is one of a plurality of set-up works, and the display device is further configured to display the progress status of the plurality of set-up works in a list format.

7. The component mounting system of claim 1, wherein the display device is further configured to display, as the progress status of the first of the component mounting lines, a scheduled changing time at which the set-up work of the first work order stops, and production of the mounting board in the first of the component mounting lines starts.

8. The component mounting system of claim 1, wherein the display device is further configured to display, as the progress status of the first of the component mounting lines, a scheduled production start time at which the set-up work of the first work order is completed and production of the next mounting board is started in the first of the component mounting lines.

9. The component mounting system of claim 1, further comprising:
a portable terminal into which a progress of the set-up work of the first work order is input,
wherein the storage device is further configured to acquire information from the portable terminal via wireless communication, and
wherein the display device is further configured to display, as the progress status of the first of the component mounting lines, information specifying the set-up work of the first work order by changing a color according to the progress transmitted from the portable terminal.

10. A progress display system of set-up work comprising:
a storage device connected to a plurality of component mounting lines, each of the component mounting lines having a plurality of mounting board manufacturing machines connected via a network, the storage device being configured to acquire information from each of the plurality of mounting board manufacturing machines of each of the plurality of component mounting lines; and
a display device connected to the storage device via the network, the display device being configured to display a progress status of each of the plurality of component mounting lines, including a progress status of set-up work of a first work order performed when changing a type of mounting board manufactured by a first of the component mounting lines, based on the information stored in storage device,
wherein the display device is further configured to displays, as the progress status of the first of the component mounting lines:
a scheduled completion time at which the set-up work of the first work order is to be completed without stopping production of the mounting board in the first of the component mounting lines; and
a work delay time of the first work order of the first of the component mounting lines with respect to the scheduled completion time.

11. The progress display system of set-up work of claim 10, wherein the storage device is connected to a set-up work support device via the network to acquire information from the set-up work support device, the set-up work support device being configured to support the set-up work of the first work order without stopping production of the mounting board in the first of the component mounting lines.

12. The progress display system of set-up work of claim 10, wherein the display device is further configured to display a progress rate of the set-up work of the first work order as the progress status of the first of the component mounting lines.

13. The progress display system of set-up work of claim 10, wherein the display device is further configured to display the progress status of the first of the component mounting lines with a color changed according to a length of the work delay time.

14. The progress display system of set-up work of claim 10, wherein the display device is further configured to display, as the progress status of the first of the component mounting lines:
the number of workers who are in charge of the set-up work of the first work order on a plan; and
the number of workers who are in charge of the set-up work of the first work order added other than the plan.

15. The progress display system of set-up work of claim 10, wherein the set-up work of the first work order is one of a plurality of set-up works, and the display device is further configured to display the progress status of the plurality of set-up works in a list format.

16. The progress display system of set-up work of claim 10, wherein the display device is further configured to display, as the progress status of the first of the component mounting lines, a scheduled changing time at which the set-up work of the first work order stops, and production of the mounting board in the first of the component mounting lines starts.

17. The progress display system of set-up work of claim 10, wherein the display device is further configured to display, as the progress status of the first of the component mounting lines, a scheduled production start time at which the set-up work of the first work order is completed and production of a next mounting board is started in the first of the component mounting lines.

18. The progress display system of set-up work of claim 10,
wherein the storage device is further configured to acquire information from a portable terminal, into which a progress of the set-up work of the first work order is input, via wireless communication, and
wherein the display device is further configured to display, as the progress status of the first of the component mounting lines, information specifying the set-up work of the first work order by changing a color according to the progress transmitted from the portable terminal.

19. The component mounting system of claim 1, wherein the display device is further configured to display, as a progress status of a second of the component mounting lines or as a progress status of a second work order of the first of the component mounting lines, a work delay time caused by the work delay time of the first work order of the first of the component mounting lines.

20. The progress display system of set-up work of claim 10, wherein the display device is further configured to display, as a progress status of a second of the component mounting lines or as a progress status of a second work order of the first of the component mounting lines, a work delay time caused by the work delay time of the first work order of the first of the component mounting lines.

* * * * *